(12) United States Patent　　(10) Patent No.: US 11,937,397 B2
Okumura　　(45) Date of Patent: Mar. 19, 2024

(54) ELECTRONIC DEVICE FOR ENSURING ELECTRONIC PART COOLING PERFORMANCE DESPITE TEMPORAL COOLING AIRFLOW INTERRUPTION

(71) Applicant: NEC Platforms, Ltd., Kawasaki (JP)

(72) Inventor: Kenji Okumura, Kanagawa (JP)

(73) Assignee: NEC Platforms, Ltd., Kanagawa (JP)

(*) Notice: Subject to any disclaimer, the term of this patent is extended or adjusted under 35 U.S.C. 154(b) by 175 days.

(21) Appl. No.: 17/292,788

(22) PCT Filed: Nov. 5, 2019

(86) PCT No.: PCT/JP2019/043187
§ 371 (c)(1),
(2) Date: May 11, 2021

(87) PCT Pub. No.: WO2020/100645
PCT Pub. Date: May 22, 2020

(65) Prior Publication Data
US 2021/0400841 A1　　Dec. 23, 2021

(30) Foreign Application Priority Data
Nov. 15, 2018　(JP) ................. 2018-214588

(51) Int. Cl.
*H05K 7/00*　　(2006.01)
*H05K 7/20*　　(2006.01)

(52) U.S. Cl.
CPC ..... *H05K 7/20145* (2013.01); *H05K 7/20154* (2013.01); *H05K 7/2039* (2013.01)

(58) Field of Classification Search
CPC .......... H05K 7/20145; H05K 7/20154; H05K 7/2039; H05K 7/20727; H05K 7/20172;
(Continued)

(56) References Cited

U.S. PATENT DOCUMENTS 5,949,646 A * 9/1999 Lee ................. H05K 7/2019
　　　　　　　　　　　　　　　　　　165/104.34
6,330,155 B1 * 12/2001 Remsburg .......... H05K 7/20154
　　　　　　　　　　　　　　　　　　236/49.5
(Continued)

FOREIGN PATENT DOCUMENTS

CN　　201016601 Y　　2/2008
CN　　205883769 U　　1/2017
(Continued)

OTHER PUBLICATIONS

International Search Report for PCT Application No. PCT/JP2019/043187, dated Jan. 21, 2020.
(Continued)

*Primary Examiner* — Mandeep S Buttar

(57) ABSTRACT

An electronic device includes a housing, a plurality of fans aligned in a width direction of the housing, a partition board which is interposed between a plurality of fans adjoining each other in the width direction of the housing and extended in a downstream side of a flow direction of wind caused by a plurality of fans, an electronic part which is disposed to consecutively join the partition board in the downstream side of the flow direction of the wind, and a passage resistor which is disposed in a further downstream side of the flow direction of the wind from the electronic part.

7 Claims, 6 Drawing Sheets

(58) Field of Classification Search
CPC .......... H05K 7/20572; H05K 7/20736; H05K 7/20918; H05K 7/20909; G06F 1/20; G06F 1/181
See application file for complete search history.

(56) References Cited

U.S. PATENT DOCUMENTS

| | | | |
|---|---|---|---|
| 6,594,148 B1* | 7/2003 | Nguyen | H05K 7/20581 361/695 |
| 6,735,081 B1* | 5/2004 | Bishop | H05K 7/20727 174/16.3 |
| 9,521,778 B2* | 12/2016 | Lin | H05K 7/20181 |
| 10,629,396 B2* | 4/2020 | Skibinski | H02B 1/565 |
| 2002/0054479 A1* | 5/2002 | Wu | H05K 7/20727 361/695 |
| 2006/0099092 A1* | 5/2006 | Lu | F04D 29/601 417/423.1 |
| 2007/0242426 A1* | 10/2007 | Coster | H05K 5/0221 361/679.48 |
| 2009/0183865 A1* | 7/2009 | Miyahara | H01L 23/467 165/47 |
| 2010/0218920 A1* | 9/2010 | Vaananen | H05K 7/20581 29/890.035 |
| 2014/0016268 A1* | 1/2014 | Tsujimura | G06F 1/20 361/695 |
| 2014/0036439 A1* | 2/2014 | Huang | H05K 7/20727 361/692 |
| 2014/0364048 A1* | 12/2014 | Milligan | H05K 7/20581 454/184 |
| 2016/0369815 A1* | 12/2016 | Wilcox | F04D 29/522 |
| 2018/0100512 A1* | 4/2018 | Chen | G02B 6/0008 |
| 2019/0045659 A1* | 2/2019 | Donachy | H05K 7/20727 |

FOREIGN PATENT DOCUMENTS

| | | |
|---|---|---|
| CN | 208047119 U | 11/2018 |
| JP | S50-052870 U | 5/1975 |
| JP | S63-009198 A | 1/1988 |
| JP | H07-100732 A | 4/1995 |
| JP | 2012-028417 A | 2/2012 |
| JP | 2018-006479 A | 1/2018 |
| JP | 2018-112810 A | 7/2018 |

OTHER PUBLICATIONS

Japanese Office Action (JP Application No. 2018-214588) dated Jan. 14, 2020 with English Translation.
Taiwanese Office Action for TW Application No. 108140548 dated Mar. 22, 2022 with English Translation.

* cited by examiner

ELECTRONIC DEVICE FOR ENSURING ELECTRONIC PART COOLING PERFORMANCE DESPITE TEMPORAL COOLING AIRFLOW INTERRUPTION

This application is a National Stage Entry of PCT/JP2019/043187 filed on Nov. 5, 2019, which claims priority from Japanese Patent Application 2018-214588 filed on Nov. 15, 2018, the contents of all of which are incorporated herein by reference, in their entirety.

TECHNICAL FIELD

The present invention relates to an electronic device.

BACKGROUND ART

In order to cool heating parts disposed inside housings, various types of electronic devices such as computer devices have been equipped with fans configured to cause a flow of cooling air inside housings by taking in the air from the outside of housings. Patent Document 1 discloses a cooling unit configured to cool an electronic device having a plurality of electronic-circuit packages disposed inside its housing (or its casing) using a plurality of exhaust fans. The cooling unit is mounted on the upper face of the casing and includes a vent room configured to communicate with the inside of the casing, a plurality of separate ducts which are mounted on the upper face of the vent room and separated from each other via partition walls, a plurality of exhaust fans disposed at the exits of separate ducts, and a plurality of backflow-blocking boards for sealing passages of separate ducts due to a stoppage of exhaust fans.

CITATION LIST

Patent Literature Document

Patent Document 1: Japanese Patent Application Publication No. S63-9198

SUMMARY OF INVENTION

Technical Problem

When part of multiple fans installed inside a housing stops its operation due to a failure, a flow of cooling air may disappear in a separate duct equipped with the stopped fans, which in turn causes a problem in that the cooling performance will be reduced when cooling electronic parts disposed above a flow passage of the cooling air transmitted through the separate duct. In addition, it is necessary to replace electronic parts with new ones due to a failure that has occurred in electronic parts disposed inside the housing. When multiple pairs of electronic parts are disposed inside the housing of an electronic device, however, users may request online to replace part of the electronic parts with new ones alone in a conducting state not to stop the overall operation of an electronic device. In this case, when part of multiple fans is solely removed from the housing of an electronic device for the purpose of replacement of electronic parts, the cooling air may disappear in the separate duct equipped with the removed fans. Therefore, the online replacement may cause a reduction of the cooling performance to cool electronic parts disposed above the flow passage of the cooling air transmitted through the separate duct.

The present invention is made in consideration of the aforementioned problem, and therefore the present invention aims to provide an electronic device configured to prevent a reduction of the cooling performance to cool electronic parts installed in the housing of an electronic device.

Solution to Problem

An electronic device according to the present invention includes a housing, a plurality of fans aligned in a width direction of the housing, a partition board which is interposed between a plurality of fans adjoining each other in the width direction of the housing and extended in a downstream side of a flow direction of a wind caused by a plurality of fans, an electronic part which is disposed to consecutively join the partition board in the downstream side of the flow direction of the wind, and a passage resistor which is disposed in a further downstream side of the flow direction of the wind from the electronic part.

Advantageous Effects of Invention

According to the present invention, it is possible for an electronic device to achieve an effect of securing adequate cooling performance to cool electronic parts installed in a housing.

DESCRIPTION OF EXEMPLARY EMBODIMENTS

The present invention will be described in detail by way of exemplary embodiments with reference to the accompanying drawings. Herein, the same constituent elements drawn in multiple drawings will be denoted by the same reference signs; hence, their descriptions will be appropriately omitted here.

First Exemplary Embodiment

Figure 1:
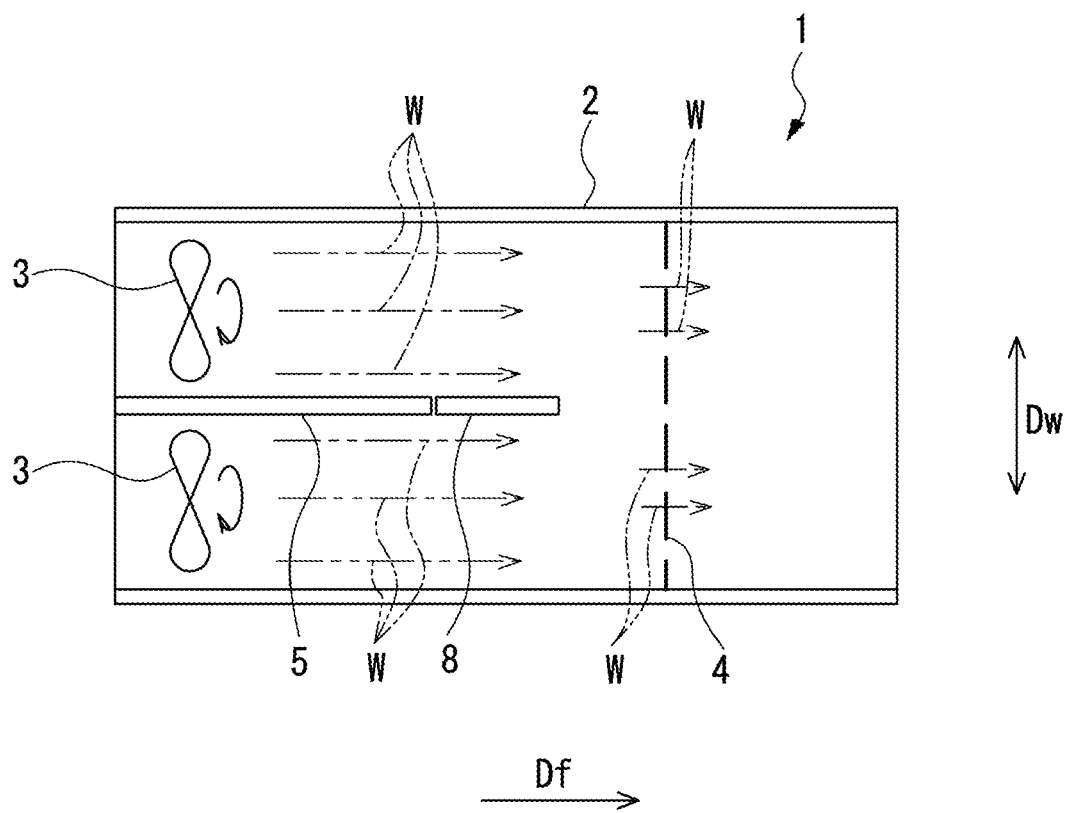
FIG. 1 is a plane sectional view of an electronic device according to the first exemplary embodiment of the present invention.

FIG. 1 is a sectional view of an electronic device 1 according to the first exemplary embodiment of the present invention. The electronic device 1 includes a housing 2, a plurality of fans 3, a passage resistor 4, a partition board 5, and an electronic part 8. In the first exemplary embodiment, the electronic device 1 is configured of a controller of a server device, wherein a plurality of electronic devices 1 are mounted on server racks (not shown) and stacked together with a plurality of server devices in a vertical direction.

A plurality of fans 3 are aligned in a width direction Dw of the housing 2. In the first exemplary embodiment, for example, two fans 3 are installed in the housing 2 so as to cause wind W to flow in a direction from the fans 3 to the passage resistor 4. In this connection, a direction of the wind W caused by the fans to flow toward the passage resistor 4 in the housing 2 will be referred to as a flow direction Df.

The passage resistor 4 is disposed in a downstream side of the flow direction Df of the wind W caused by the multiple fans 3. The passage resistor 4 is provided to establish a passage resistance against the wind W. The partition board 5 is interposed between the fans 3 which are disposed adjacent to each other in the width direction Dw of the housing 2. The partition board 5 extends from the upstream side to the downstream side of the flow direction Df of the wind W.

The electronic part 8 is laid in the flow direction Df of the wind W and interposed between the partition board 5 and the passage resistor 4. The electronic part 8 is positioned to consecutively join the partition board 5 in the flow direction Df of the wind W. That is, the electronic part 8 is positioned to consecutively join the partition board 5 in the extended direction of the partition board 5 and in the downstream side of the flow direction Df of the wind W. Due to the positioning of the electronic part 8 in the extending direction of the partition board 5, as described above, it is possible to cause wind flow Fr which may go around the downstream side of the electronic part 8 between one side and the other side of the partition board 5 in the width direction Dw.

When the electronic device 1 operates both the fans 3 adjoining each other in the width direction Dw of the housing 2, the wind W caused by the fans 3 may flow from the upstream side to the downstream side in the flow direction Df That is, the wind W caused by the fans 3 may flow along the partition board 5 to reach the electronic part 8 disposed in the downstream side of the partition board 5, thus cooling the electronic part 8. The wind W that has already passed through the electronic part 8 may further flow in the downstream side of the flow direction Df to reach the passage resistor 4.

Figure 2:
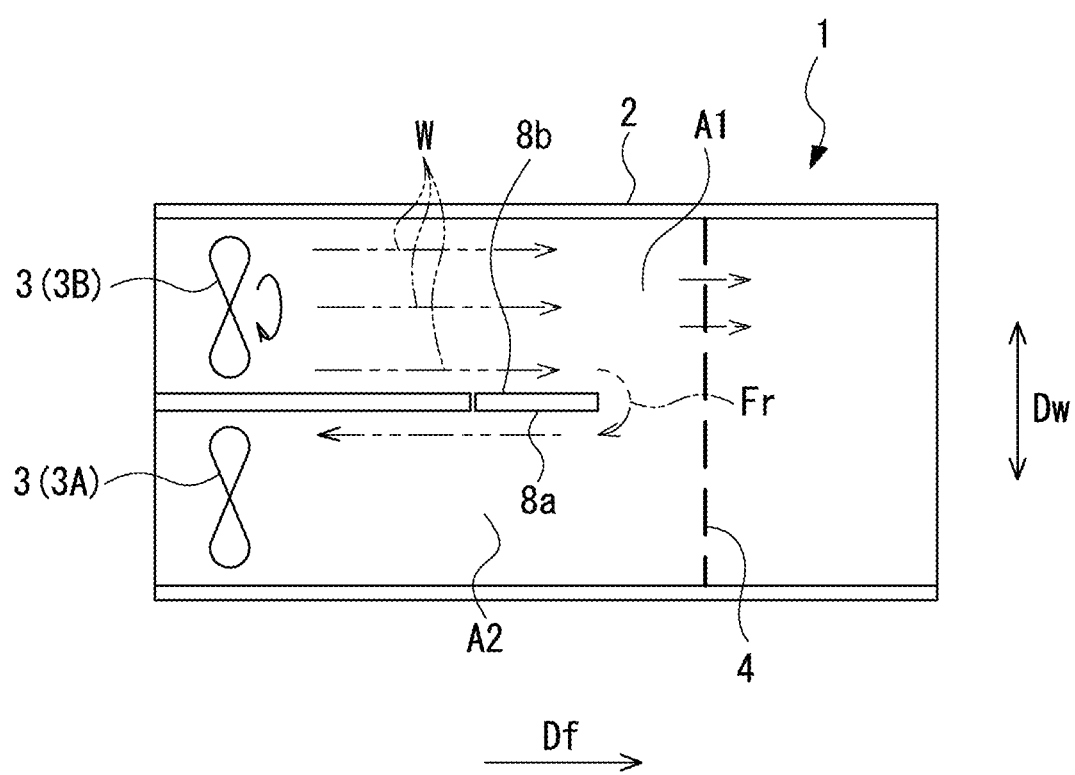
FIG. 2 is a plane sectional view showing an airflow in a stoppage of the air caused by one fan inside the housing of the electronic device according to the first exemplary embodiment of the present invention.

FIG. 2 is a sectional view showing a flow of the wind W in the housing 2 of the electronic device 1 according to the first exemplary embodiment of the present invention when one of the fans 3 stops its operation. For the sake of distinctly explaining the fans 3 adjoining each other in the width direction Dw of the housing 2, it is assumed that a fan 3A is disposed on one side of the housing 2 in the width direction Dw while another fan 3B is disposed on the other side of the housing 2. In addition, reference sign 8a indicates one side of the electronic part 8 consecutively adjoining the partition board 5 in the width direction Dw while reference sign 8b indicates the other side of the electronic part 8 in the width direction Dw. Moreover, reference sign A1 indicates the other region from the partition board 5 in the width direction Dw while reference sign A2 indicates one region from the partition board 5 in the width direction Dw.

In FIG. 2, when the fan 3A stops its operation or when the fan 3A is removed from the housing 2 for the purpose of replacement, the wind W caused by the fan 3A may disappear while the other fan 3B continues its operation. The wind W caused by the fan 3B may flow from the upstream side to the downstream side in the flow direction Df. In other words, the wind W caused by the fan 3B may still flow along the partition board 5 in the housing 2 to reach the electronic part 8 disposed in the downstream side of the flow direction Df, thus cooling the other side 8b of the electronic part 8 in the width direction Dw.

The wind W that has already passed through the electronic part 8 may further flow in the downstream side of the flow direction Df to reach the passage resistor 4. The passage resistor 4 serves as a passage resistance against the wind W caused by the other fan 3B. This may increase the pressure in the other region A1 from the partition board 5 in the width direction Dw, which is provided with the other fan 3B, in the upstream side of the flow direction Df of the wind W. In contrast, due to the disappearance of wind cause by the fan 3A in the one region A2 of the width direction Dw provided with the fan 3A, the one region A2 communicates with the outside of the housing 2 through the installed position of the fan 3A. For this reason, the pressure of the one region A2 provided with the fan 3A becomes lower than the pressure of the other region A1 provided with the fan 3B. Accordingly, at least part of the wind W cause by the other fan 3B which continues its operation may go around the downstream side in the flow direction Df toward the electronic part 8 and flow into the one region A2 from the partition board 5 (i.e. one region provided with the fan 3A). This may cause the wind flow Fr to go around the downstream side of the flow direction Df of the wind W toward the electronic part 8 from the other region A1 to the one region A2 relative to the partition board 5 in the width direction Dw. Accordingly, it is possible to cool the other side 8b of the electronic part 8 by the wind W caused by the other fan 3B while cooling the one side 8a of the electronic part 8 by the wind flow Fr.

As a result, it is possible to secure the cooling performance to cool the electronic part 8 installed in the housing 2 even when part of multiple fans 3 stops its operation or even when part of multiple fans 3 is replaced with a new one. The first exemplary embodiment is designed such that the electronic part 8 is disposed to consecutively join the partition board 5 in the downstream side of the flow direction Df of the wind W, but it is possible to position the electronic part 8 to tightly join the partition board 5 in the flow direction Df of the wind W, or it is possible to provide a gap between the partition board 5 and the electronic part 8. However, a relatively large gap formed between the partition board 5 and the electronic part 8 may increase the amount of wind passing through the gap in the width direction Dw, thus decreasing the amount of wind going around the electronic part 8.

In the above, it is unnecessary to limit the electronic part 8 in terms of its type, its shape, and its configuration. The first exemplary embodiment requires installation of a plurality of fans 3 in the housing 2; but the number of fans 3 is not necessarily limited to two, and therefore it is possible to align three or more fans 3 in the width direction Dw. The passage resistor 4 may be configured of a porous substance or a mesh material having many openings formed therein. Alternatively, it is possible to reduce the passage area of the wind W transmitted through the passage resistor 4 in the downstream side rather than the upstream side.

Second Exemplary Embodiment

Figure 3:
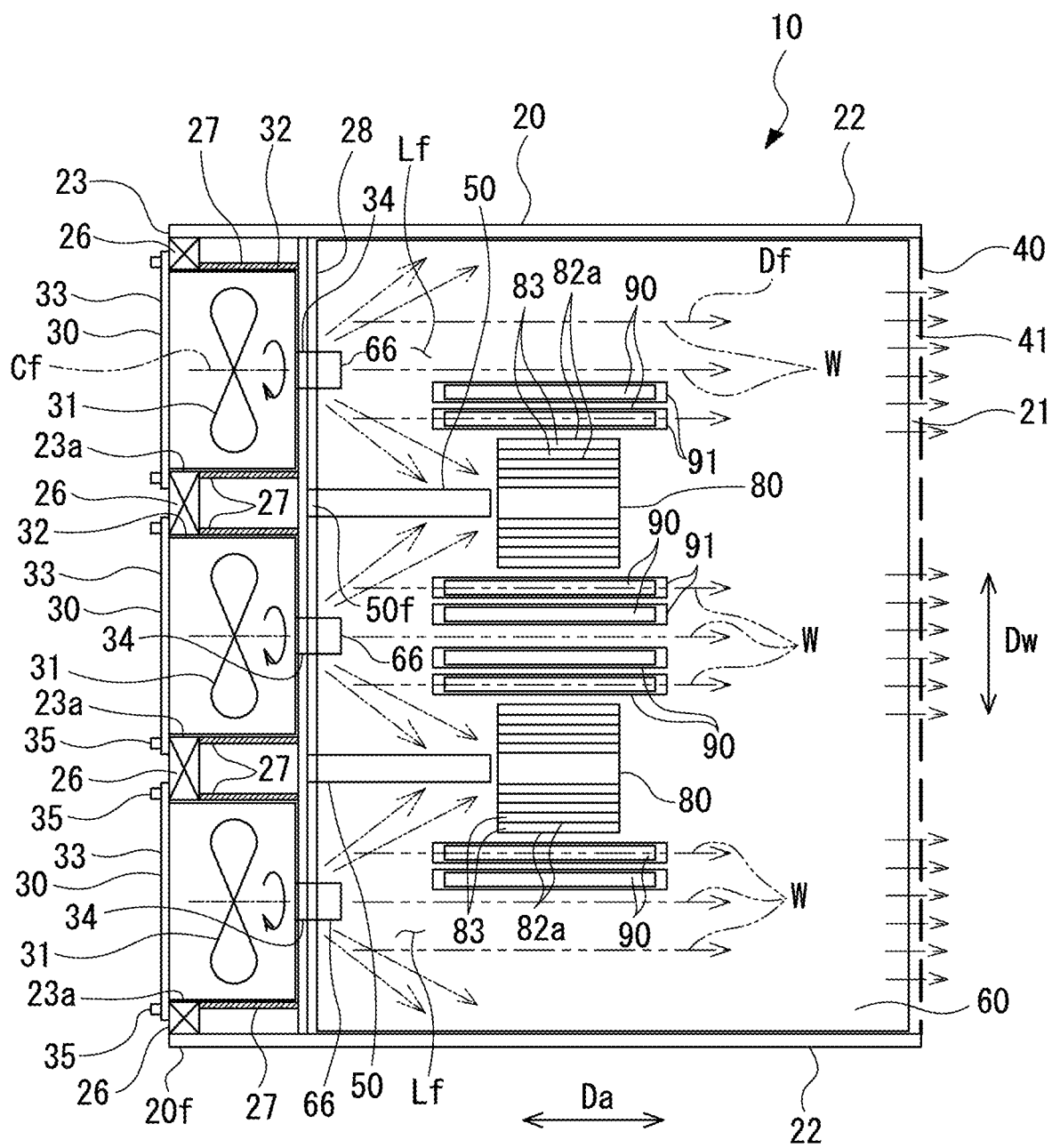
FIG. 3 is a plane sectional view of an electronic device according to the second exemplary embodiment of the present invention.
Figure 4:
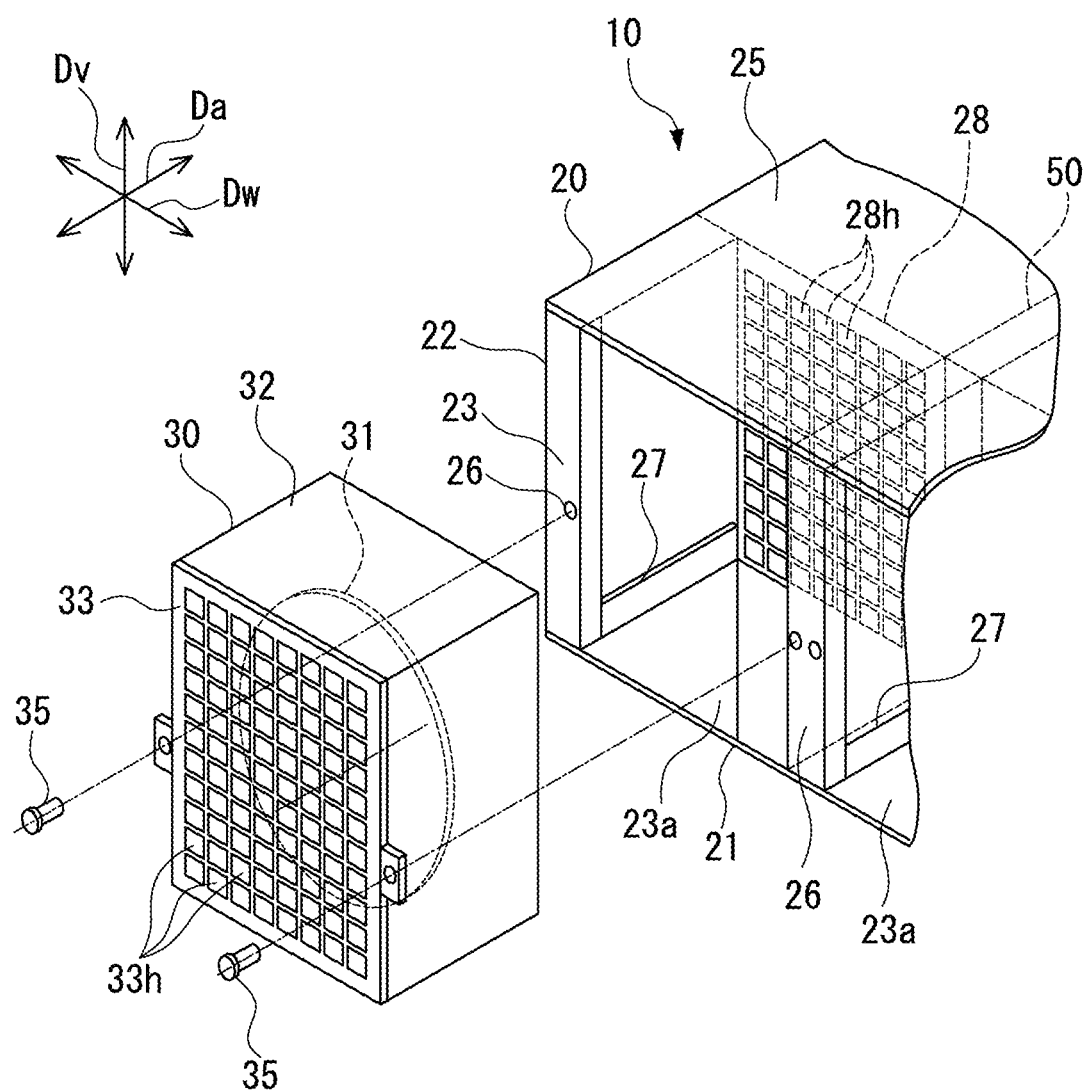
FIG. 4 is a perspective sectional view showing an attaching structure to attach a fan unit to the housing of the electronic device according to the second embodiment of the present invention.
Figure 5:
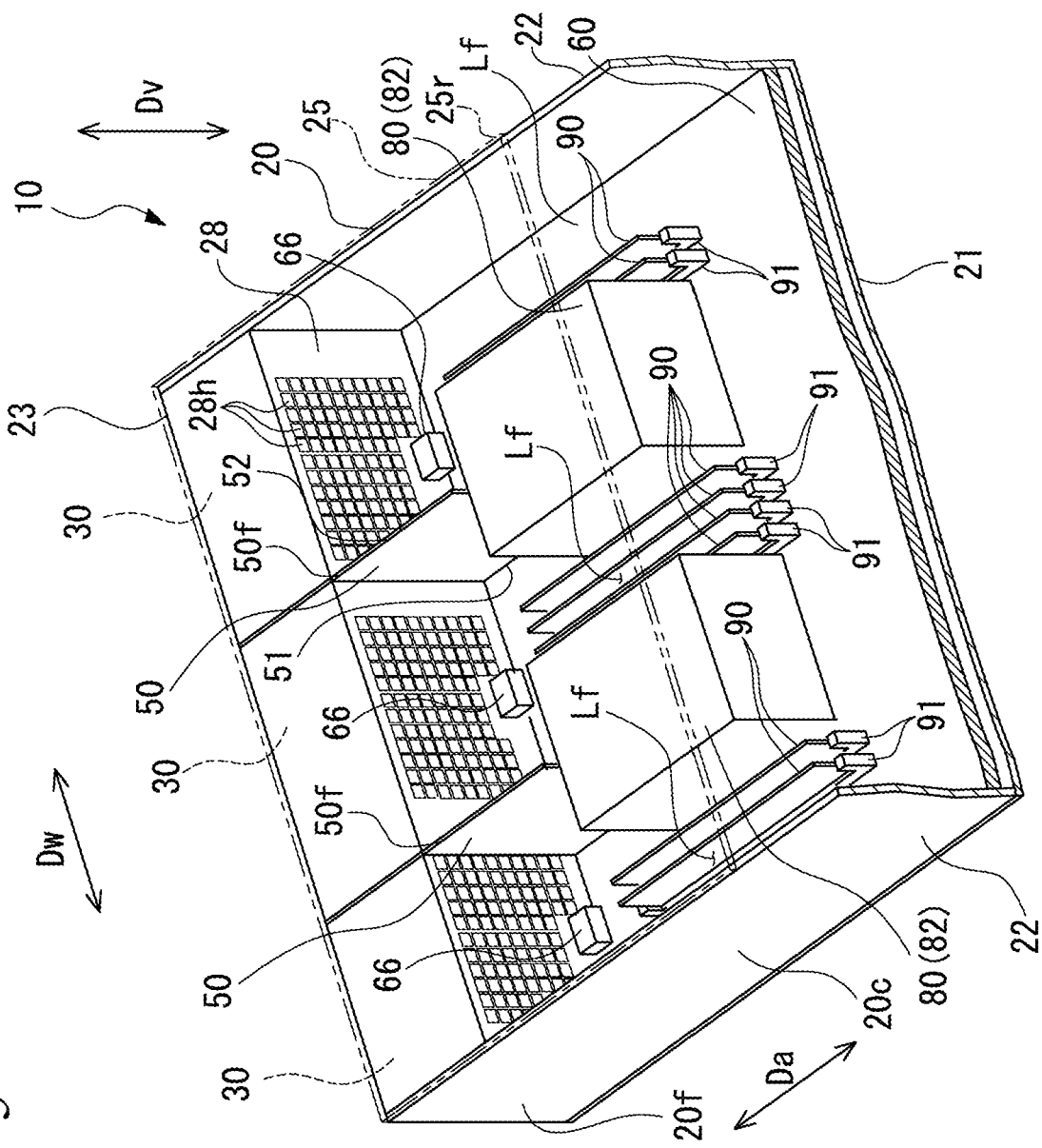
FIG. 5 is a perspective sectional view showing the interior structure of the housing of the electronic device according to the second exemplary embodiment of the present invention.

FIG. 3 is a plane sectional view of an electronic device according to the second exemplary embodiment of the present invention. FIG. 4 is a perspective sectional view showing an attaching structure of a fan unit 30 to be attached to a housing 20 of the electronic device 10. FIG. 5 is a perspective sectional view showing an internal configuration of the housing 20 of the electronic device 10. As shown in FIG. 3, the electronic device 10 includes the housing 20, a plurality of fan units 30, a passage resistor 40, partition boards 50, and CPU (Central Processing Unit) units (or electronic parts) 80.

As shown in FIG. 3 through FIG. 5, the housing 20 forming an outer shell of the electronic device 10 has a hollow-box shape for storing CPU units 80 therein. The housing 20 includes a baseboard 21, a pair of sideboards 22, a front board 23, and an upper board 25 (see FIG. 4). In the following descriptions, the width direction Dw is defined as a direction of opposing the pair of sideboards 22; a vertical direction (or an upper-lower direction) Dv is defined as a direction perpendicular to the baseboard 21; a front-rear direction Da is defined as a direction perpendicular to both the width direction Dw and the vertical direction Dv.

The baseboard 21 forms the lower face of the housing 20. The baseboard 21 has a rectangular shape in plan view. The pair of sideboards 22 is disposed on the opposite sides of the width direction Dw. The pair of sideboards 22 is positioned to rise upwards from the opposite ends of the baseboard 21 in the width direction Dw.

As shown in FIGS. 3 and 4, the front board 23 is attached to the front-end portion of the housing 20 in the front-rear direction Da and equipped with a plurality of support rods 26. A plurality of support rods 26 is disposed in the width direction Dw with intervals of distance therebetween. The support rod 26 extends in the vertical direction Dv and is connected to the baseboard 21 and the upper board 25. A plurality of fan openings 23a is interposed between the pair of sideboards 22 and a plurality of the support rods 26 and disposed with intervals of distance therebetween in the width direction Dw. The fan unit 30 is detachably attached to the fan opening 23a. In addition, a guide 27 is formed in the rear of the support rod 26 in the front-rear direction Da. The guide 27 rises upwardly from the baseboard 21 and extends in the rear from the support rod 26 in the front-rear direction Da.

An intermediate board 28 is disposed in the rear of the front-rear direction Da in association with the front board 23 and the guide 27. The intermediate board 28 is disposed at an intermediate portion of the housing 20 in the front-rear direction D with an interval of distance from the front board 23 in the front-rear direction Da. As shown in FIG. 5, the intermediate board 28 having a plate-like shape is disposed in parallel with the front board 23. That is, the intermediate board 28 is disposed in a plane rising from the baseboard 21 in the vertical direction Dv at the intermediate position of the housing 20 in the front-rear direction Da. A pair of opposite ends of the intermediate board 28 (or the opposite ends lying in the width direction Dw) is connected to the pair of sideboards 22. A plurality of holes 28h is formed in the intermediate board 28 at the position opposite to the fan opening 23a in the front-rear direction Da of the housing 20. A plurality of holes 28h runs through the intermediate board 28 in its width direction (i.e. the front-rear direction Da).

The upper board 25 is disposed in association with the baseboard 21 with a predetermined interval of distance therebetween in the vertical direction Dv. The upper board 25 is attached onto the pair of sideboards 22. In the second exemplary embodiment, the upper board 25 is disposed to close the space above the pair of sideboards 22 within a range from a front end 20f to an intermediate portion 20c of the housing 20 in the front-rear direction Da. For this reason, the space above the pair of sideboards 22 is opened upwardly in the rear portion extended rearwardly from a rear end 25r (i.e. a straight-line portion indicated by a dashed line in FIG. 5) of the upper board 25 positioned at the intermediate portion 20c of the housing 20 in the front-rear direction Da. Since another server device is stacked above the electronic device 1 mounted on the server rack, the space above the pair of sideboards 22 is substantially closed by another server device.

A plurality of server units 30 is aligned in the width direction Dw of the housing 20. In the second exemplary embodiment, for example, three fan units 30 are aligned in the width direction Dw. The fan unit 30 includes a fan (i.e. a circular portion indicated by dotted circles in FIG. 4), a fan chassis 32, and a fan cover 33.

The fan 31 has a plurality of blades around a center axis Cf extended in the front-rear direction Da (see FIG. 3). The fan 31 is driven by a motor (not shown) to rotate about the center axis Cf.

The fan chassis 32 is arranged outside of the fan 31 in its diameter direction. The fan chassis 32 supports the fan 31 and its motor (not shown). The fan chassis 32 can be inserted into and extracted from the fan opening 23a of the housing 20. The fan chassis 32 can be slidably moved within the fan opening 23a on the baseboard 21 in the front-rear direction Da. Accordingly, it is possible to individually and detachably attach the fan unit 30 into the fan opening 23a.

As shown in FIG. 3, the fan chassis 32 is equipped with a connector 34. When the fan unit 30 is detachably attached to the fan opening 23a, the connector 34 will be correspondingly connected to a receiving connector 66 attached onto an electronic-circuit substrate 60 (see FIGS. 3 and 5).

As shown in FIG. 4, the fan cover 33 is attached to the front end of the fan unit 30 in the front-rear direction Da. The fan cover 33 is fixed to the fan chassis 32. The fan cover 33 having a plate-like shape is positioned within a plane rising in the vertical direction Dv. The fan cover 33 has a plurality of holes 33h running through in its width direction (i.e. the front-rear direction Da). The fan cover 33 is detachably attached to the support rods 26 using a pair of attaching screws 35.

When the fan 31 rotates about the center axis Cf, the fan unit 30 causes the wind W to flow toward the passage resistor 40 disposed in the rear portion of the housing 20 in the front-rear direction Da. In the following descriptions, the direction of the wind W which is caused by the fan unit 30 to flow toward the passage resistor 40 in the housing 20 will be referred to as the flow direction Df of the wind W.

As shown in FIG. 3, the passage resistor 40 is disposed in the downstream side of the flow direction Df of the wind W caused by a plurality of fan units 30. In the second exemplary embodiment, the passage resistor 40 having a plate-like shape is positioned within a vertical plane perpendicular to the front-rear direction Da of the housing 20. For example, the passage resistor 40 is interposed between the rear ends of the sideboards 22 in the front-rear direction. The passage resistor 40 has a plurality of through-holes 41 running through its width direction (i.e. the front-rear direction Da). The passage resistor 40 having a plurality of through-holes 41 serves as a passage resistance against the wind W.

As shown in FIGS. 3 and 5, the partition board 50 is interposed between the fan units 30 adjoining together in the width direction Dw of the housing 20. A plurality of partition boards 50 is disposed rearwardly from the intermediate board 28 in the front-rear direction Da. The partition board 50 is extended from its front end 50f joining the intermediate board 28 in the downstream side of the flow direction Df of the wind W. The partition board 50 made up of a rectangular plate when viewed in the width direction Dw is positioned within a plane in the front-rear direction Da of the housing 20. The partition board 50 has a predetermined length lying in the front-rear direction Da. When the partition board 50 is viewed in the width direction Dw, a lower end 51 of the partition board 50 is laid along the baseboard 21 (or the electronic-circuit substrate 60 which will be described later) while an upper end 52 of the partition board 50 is laid along the lower face of the upper board 25.

The electronic-circuit substrate 60 is arranged inside the aforementioned housing 20. The electronic-circuit substrate 60 made up of a rectangular plate in plan view is laid along the baseboard 21. In this connection, the partition board 50 is disposed above the electronic-circuit substrate 60.

The CPU units 80 and memory units (or other electronic parts) are mounted on the electronic-circuit substrate 60. In the second exemplary embodiment, two CPU units 80 are disposed with an interval of distance therebetween in the width direction Dw. The CPU unit 80 has a CPU chip (not shown) mounted on the electronic-circuit substrate 60 and a heat sink 82 used for covering the CPU chip. The heat sink 82 has a plurality of fins 82a positioned with intervals of distance therebetween in the width direction Dw. The fin 82 having a plate-like shape is positioned within a plane perpendicular to the width direction Dw. The heat sink 82 has a slit 83 interposed between the fins 82a adjoining each other in the width direction Dw such that the slit 83 is extended in the front-rear direction Da (or the flow direction Df of the wind W).

The CPU unit 80 is interposed between the partition board 50 and the passage resistor 40 in the flow direction Df of the wind W. The CPU unit 80 is placed to join the partition board 50 in the downstream side of the wind W in the flow direction Df. That is, the CPU unit 80 is disposed in the extending direction of the partition board 50 and extended in the downstream side of the wind W in the flow direction Df.

The heat sink 82 of the CPU unit 80 has a rectangular parallelepiped shape. The heat sink 82 of the CPU unit 80 has larger dimensions in the width direction than the partition board 50. The center of the CPU unit 80 in the width direction Dw is set to the same position as the partition board 50 such that the opposite ends of the heat sink 82 are projected from the partition board 50 in the width direction Dw.

As described above, the partition board 50 and the CPU unit 80 are disposed to join together in the flow direction Df of the wind W caused by the fan unit 30 such that the partition board 50 and the CPU unit 80 are each positioned in the lateral side from the center axis Cf of the fan unit 30 in the width direction Dw. Accordingly, the fan unit 30 causes the wind W to flow between two pairs of the partition boards 50 and the CPU units 80 which are arranged in one side and the other side of the width direction Dw. In addition, the fan unit 30 causes the wind W to flow through a fan passage Lf formed between one sideboard 22 in the width direction and a series of the partition board 50 and the CPU unit 80 and another fan passage Lf formed between the other sideboard 22 in the width direction Dw and another series of the partition board 50 and the CPU unit 80.

A plurality of memory units 90 are arranged on the opposite sides in the width direction Dw from a series of the partition board 50 and the CPU unit 80 such that two memory units 90 are disposed on each side. That is, two memory units 90 are juxtaposed on each side in the width direction Dw from a series of the partition board 50 and the CPU unit 80. For this reason, two memory units 90 are juxtaposed in association with the CPU unit 80 in the fan passage Lf on the lateral side of the housing 20 in the width direction Dw.

The memory unit 90 is detachably attached to a socket 91 mounted on the electronic-circuit board 60. The socket 91 is extended along the surface of the electronic-circuit board 60 in the front-rear direction Da. The memory unit 90 having a plate-like shape has a rectangular shape extended in the width direction Dw and the front-rear direction Da. The memory unit 90 is laid in its longitudinal direction along the front-rear direction Da, wherein the lower end of the memory unit 90 is engaged with the socket 91.

As shown in FIG. 3, when all the fan units 30 aligned in the width direction Dw of the electronic device 10, the wind W caused by the fan units 30 will flow in the downstream side of the flow direction Df After reaching the CPU units 80 and the memory units 90, the wind W caused by the fan units 30 may cool the CPU units 90 and the memory units 90 when transmitted therethrough.

A series of the partition board 50 and the CPU units 80 are disposed aside the center axis Cf of the fan unit 80 (or the fan 31) in the width direction Dw. The wind W caused by the fan 31 may diffuse outside the center axis Cf of the fan unit 30 in its diameter direction when flowing from the upstream side to the downstream side of the flow direction Df. This makes it easy for the wind W to flow along the partition board 50 and toward the CPU unit 80 disposed in the downstream side of the flow direction Df. The opposite sides of the CPU unit 80 are projected outside the partition board 50 in the width direction Dw, and therefore the wind W flowing along the partition board 50 may reach the CPU unit 80 which is disposed to consecutively join the partition board 50 in the downstream side of the flow direction Df of the wind W. Due to the provision of the slit 83 formed between the fins 82a adjoining each other in the width direction Dw with the heat sink 82 of the CPU unit 80, part of the wind W reaching the CPU unit 80 may be transmitted through the slit 83 which is extended in the front-rear direction Da. Accordingly, the CPU unit 80 will be cooled. After reaching a series of the CPU unit 80 and the memory unit 90, the wind W will further flow in the downstream side of the flow direction Df to reach the passage resistor 40, and then the wind W will be exhausted outside the housing 20 through a plurality of through-holes 41 formed through the passage resistor 40.

Figure 6:
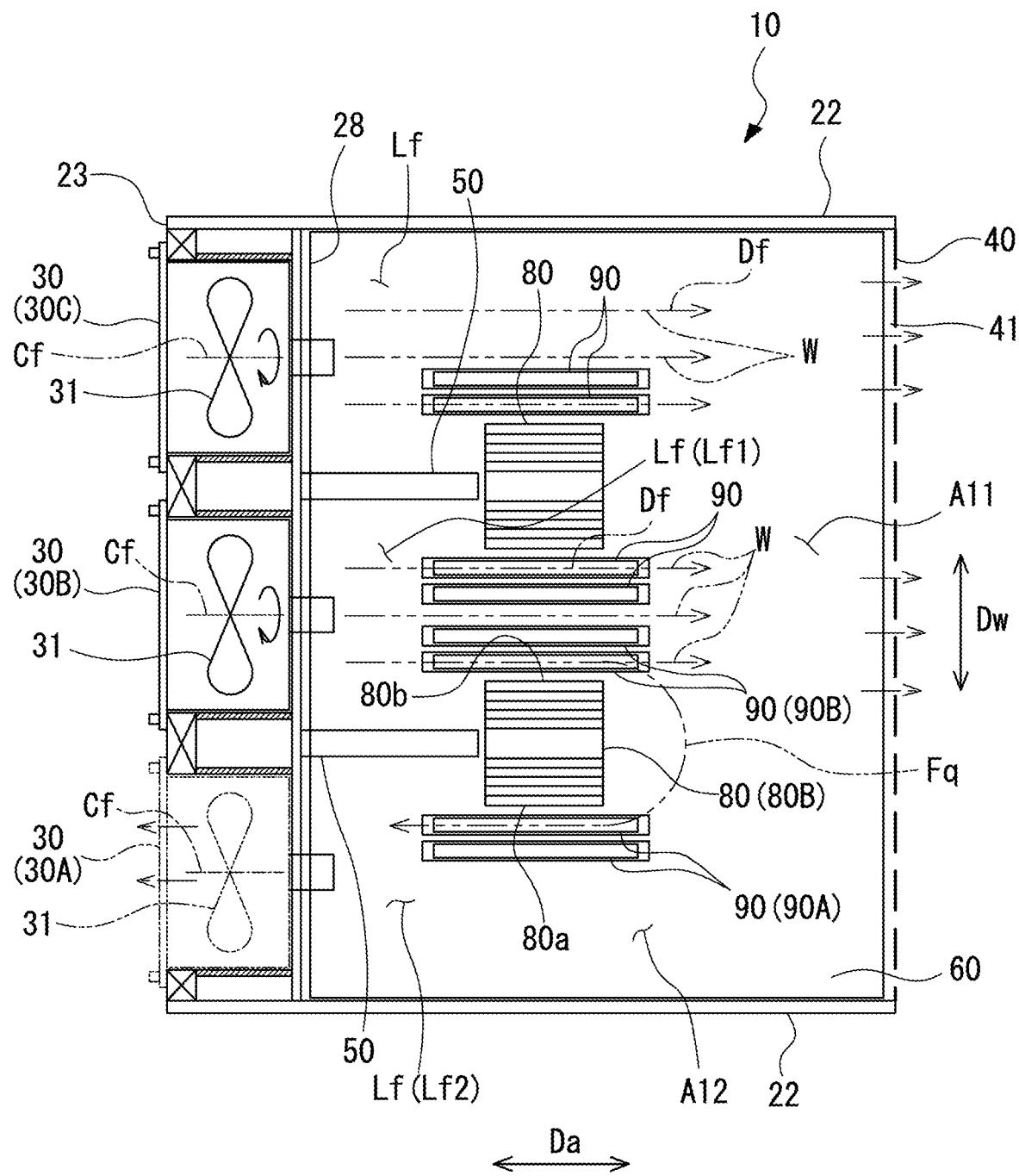
FIG. 6 is a plane sectional view showing an airflow in a stoppage of the air caused by one fan inside the housing of the electronic device according to the second exemplary embodiment of the present invention.

FIG. 6 shows a flow of the wind W inside the housing 20 when part of the fans 31 stops causing the wind W in the electronic device 10 according to the second exemplary embodiment. For the sake of explanation, FIG. 6 shows three fan units 30A, 30B, 30C aligned in the width direction Dw. In addition, a fan passage Lf is formed along the sideboard 22 adjacent to the fan unit 30C; a passage flow Lf1 is formed in association with the fan unit 30B; a fan passage Lf2 is formed along the sideboard 22 adjacent to the fan unit 30A. Moreover, the CPU unit 80B is disposed consecutively join the partition board 50 in the flow direction Df of the wind W at a position interposed between the fan unit 30A and the fan unit 30B, wherein a memory unit 90A laterally joins one side of the CPU unit 80B in association with the fan unit 30A while a memory unit 90B laterally joins the other side of the CPU unit 80B in association with the fan unit 80B. A first side face 80a is formed on one side of the CPU unit 80B in association with the fan unit 30A while a second side face 80b is formed on the other side of the CPU unit 80B in association with the fan unit 30B.

A flow of the wind W caused by the fan unit 30A may disappear in the electronic device 10 shown in FIG. 6 when the fan unit 30A stops operating the fan 31 or when the fan unit 30A is removed from the housing 20 for the purpose of replacement. On the other hand, the other fan units 30B and 30C continue their operations. The wind W caused by the fan unit 30B continuing its operation may flow through the fan passage Lf1 in the downstream side of the flow direction Df to reach and cool the memory unit 90B and the second side face 80*b* of the CPU unit 80B.

After reaching the CPU unit 80, the wind W may further flow in the downstream side of the flow direction Df to reach the passage resistor 40. The passage resistor 40 serves as a passage resistance against the wind W caused by the fan unit 30B. This may increase the pressure in a region A11 close to the passage resistor 40 in the downstream side of the fan passage Lf1 in association with the fan unit 30B. On the other hand, due to disappearance of the wind W caused by the fan unit 30A, a region A12 of the fan passage LF2 associated with the fan unit 30A communicates with the outside of the housing 20 through a plurality of through-holes 41 formed through the passage resistor 40. This will reduce the pressure of the region A12 to be lower than the pressure of the region A11. At least part of the wind W caused by the fan unit 30B continuing its operation may go around the CPU unit 80B in the downstream side of the flow direction Df and flow into the fan passage Lf2 formed in association with the fan unit 30A stopping its operation. This causes wind flow Fq to go around the CPU unit 80B in the downstream side of the flow direction Df, which may flow from the fan passage Lf1 associated with the fan unit 30B to the fan passage Lf2 associated with the fan unit 30A. The wind flow Fq will cool the first side face 80*a* of the CPU unit 80B and the memory unit 90A in proximity to the fan passage Lf2.

As described above, the electronic device 50 includes a plurality of fan units 30 aligned in the width direction Dw of the housing 20, the passage resistor 40 disposed in the downstream side of the flow direction Df of the wind W caused by a plurality of fan units 30, the partition boards 50 each interposed between the adjacent fan units 30, and the CPU units 80 each positioned to consecutively join the partition board 50 in the downstream side of the flow direction Df Due to disappearance of a flow of the wind W caused by the fan unit 30A between the fan units 30A and 30B adjoining each other in the electronic device 10, at lease part of the wind W caused by the other fan unit 30B may go around the CPU unit 80 in the downstream side of the flow direction Df to flow into the region associated with the fan unit 30A stopping its operation. Accordingly, the wind W caused by the fan unit 30B may directly cool the second side face 80*b* of the CPU unit 80B while the wind flow Fq corresponding to part of the wind W may cool the first side face 80*a* of the CPU unit 80B. That is, it is possible to cool both one side and the other side of the CPU unit 80B disposed to consecutively join the partition board 50, and therefore it is possible to improve the cooling performance. As a result, it is possible to secure the cooling performance with the CPU unit 80 in the housing 20 even when part of the fan units 30 stops its operation or even when part of the fan units 30 is replaced with new one.

In the aforementioned electronic device 10, the CPU unit 80 has larger dimensions than the partition board 50 in the width direction Dw since the opposite sides of the CPU unit 80 are seemingly projected from the lateral sides of the partition board 50 in the width direction Dw. Since the opposite sides of the CPU unit 80 are seemingly projected from the lateral sides of the partition board 50 in the width direction Dw, the wind W caused by the fan unit 30 may easily contact the CPU unit 80 during the continued operation of the fan unit 30; hence, it is possible to efficiently cool the CPU unit 80.

The slit 83 extended in the flow direction Df of the wind W is formed between the fins 82*a* of the heat sink 82 attached to each of the opposite sides of the memory unit 90 associated with the CPU unit 80 in the electronic device 10. This allows part of the wind W to flow into the slit 83 when the wind W from the fan unit 30 flows along the partition board 50, and therefore it is possible to cool the CPU unit 80 more efficiently.

In the electronic device 10, a series of the partition board 50 and the CPU unit 80 are disposed aside the center axis Cf of the fan unit 30 in the width direction Dw. For this reason, the wind W from the fan unit 30 may diffuse outside from the center of the fan unit 30 in its diameter direction when the wind W flows from the upstream side to the downstream side of the flow direction Df. This makes it easy for the wind W from the fan unit 30 to directly contact the CPU unit 80, and therefore it is possible to cool the CPU unit 80 more efficiently.

In the electronic device 10, a plurality of fan units 30 can be each detachably and individually attached to the housing 20. According to the needs to replace one fan unit 30 with a new one among a plurality of fan units 30, it is possible to solely remove the fan unit 30 from the housing 20. For this reason, it is possible to solely replace one fan unit 30 with a new one while the other fan units 30 continue their operations. During a period of stopping the wind W to be caused by the replaced fan unit 30, at least part of the wind W from the other fan units 30 continuing their operations may go around the CPU unit 80 in its downstream side and flow into an opposite region from the partition board 50 (i.e. a region close to the replaced fan unit 30). This makes it possible to cool the CPU unit 80 consecutively joining the partition board 50 on one side of the partition board 50 as well as on the other side of the partition board 50, and therefore it is possible to improve the cooling performance with the entirety of the CPU unit 80.

In the electronic device 10, the memory units 90 are attached to the side face of the CPU unit 80 in the width direction Dw with respect to a series of the CPU unit 80 and the partition board 50. Accordingly, in a period of stopping the wind W from one fan unit 30, at least part of the wind W from the other fan units 30 continuing their operations may go around the downstream side of the CPU unit 80 and flow into an opposite region of the partition board 50 (i.e. a region close to the fan unit 30 to be replaced), thus reaching the memory unit 90 arranged on the opposite side of the partition board 50 with respect to a series of the CPU unit 80 consecutively joining the partition board 50. Accordingly, it is possible to effectively cool one memory unit 90 on one side of the partition board 50 as well as the other memory unit 90 on the other side of the partition board 50 in association with the CPU unit 80.

In this connection, the present exemplary embodiment is designed such that the CPU unit 80 is disposed to consecutively join the partition board 50 in the downstream side of the flow direction Df of the wind W, however, it is possible to tightly connect the partition board 50 and the CPU unit 80, or it is possible to form a gap between the partition board 50 and the CPU unit 80. However, a relatively large gap formed between the partition board 50 and the CPU unit 80 may increase the amount of wind propagating through the gap in the width direction Dw, which in turn may decrease the amount of the wind W going around the downstream side of the CPU unit 80.

It is not necessary to limit the CPU unit 80 in terms of its type, its shape, and its configuration. The slit 83 is formed between the fins 82a of the heat sink 82 and extended in the flow direction Df, however, it is possible to form the slit 83 which may be extended in a direction (e.g. the width direction Dw) perpendicular to the flow direction Df.

In the aforementioned exemplary embodiments, the passage resistor 40 is not necessarily limited in terms of its structure as long as the passage resistor 40 serves as a passage resistance against the wind W. For example, the passage resistor 40 may be made up of a mesh material or a porous substance having many openings. Alternatively, it is possible to reduce the passage area of the wind W in the width direction of the passage resistor 40 positioned in the downstream side of the wind W.

An electronic device according to the present invention has been described in detail with reference to the accompanying drawings, however, the present invention is not necessarily limited to the foregoing exemplary embodiments, and therefore the present invention may embrace various changes or modifications without departing from the subject matter of the invention as defined in the appended claims.

The present application claims the benefit of priority on Japanese Patent Application No. 2018-214588 filed on Nov. 15, 2018, the subject matter of which is hereby incorporated herein by reference.

INDUSTRIAL APPLICABILITY

The applicable field of an electronic device according to the present invention is not necessarily limited to a server device, and therefore the present invention is applicable to various types of electronic control systems such as computer systems, communication systems, and management control systems.

REFERENCE SIGNS LIST 1, 10 electronic device
2, 20 housing
3, 3A, 3B, 31 fan
4, 40 passage resistor
5, 50 partition board
8 electronic part
30, 30A, 30B, 30C fan unit
80, 80B CPU unit (electronic part)
82 heat sink
83 slit
90, 90A, 90B memory unit (another electronic part)
Da front-rear direction
Df flow direction
Dv vertical direction (upper-lower direction)
Dw width direction
W wind (cooling wind)

What is claimed is:

1. An electronic device comprising:
a housing having an internal configuration defined in a width direction and a longitudinal direction;
a plurality of fans aligned in the width direction of the housing and that are each configured to cause airflow in an airflow direction along the longitudinal direction of the housing;
a partition board extending from an upstream side to a downstream side of the airflow direction and separating the internal configuration of the housing into a plurality of areas relative to the plurality of fans;
an electronic part consecutively joining the partition board in the downstream side and cooled by the airflow flowing along the partition board; and
a passage resistor disposed in the downstream side apart from the electronic part to cause part of the airflow to flow around the electronic part.

2. The electronic device according to claim 1, wherein the electronic part includes a heat sink, the heat sink projecting in the width direction of the housing more than the partition board does.

3. The electronic device according to claim 2, wherein the heat sink includes a plurality of fins providing a slit formed in the width direction of the housing and through which the airflow passes.

4. The electronic device according to claim 1, wherein the passage resistor resists the airflow caused by a currently operating fan of the plurality of fans, and has a plurality of holes configured to exhaust the airflow outside the housing when a previously operating fan of the plurality of fans stops operating and the currently operating fans continue to operate.

5. The electronic device according to claim 2, wherein the partition board and the electronic part are adjoined together in series along the longitudinal direction of the housing and are positioned aside a center of each fan of the plurality of fans in the width direction of the housing such that at least part of the airflow passes through the slit of the heat sink.

6. The electronic device according to claim 1, wherein when a fan of the plurality of fans is individually detached from the housing, another fan of the plurality of fans continues to operate to cause at least part of the airflow to cool the electronic part.

7. The electronic device according to claim 5, further comprising another electronic part juxtaposed with the electronic part aside the heat sink in the width direction of the housing.

* * * * *